United States Patent [19]

Russell et al.

[11] Patent Number: 5,659,453

[45] Date of Patent: Aug. 19, 1997

[54] ARC BURST PATTERN ANALYSIS FAULT DETECTION SYSTEM

[75] Inventors: B. Don Russell; B. Michael Aucoin, both of College Station; Carl L. Benner, Bryan, all of Tex.

[73] Assignee: Texas A&M University, College Station, Tex.

[21] Appl. No.: 593,546

[22] Filed: Jan. 30, 1996

Related U.S. Application Data

[63] Continuation of Ser. No. 138,477, Oct. 15, 1993, abandoned.

[51] Int. Cl.[6] .................................................. H02H 3/00
[52] U.S. Cl. ............................ 361/93; 361/78; 361/76
[58] Field of Search ............................ 361/62, 63, 76, 361/78, 87, 93

[56] References Cited

U.S. PATENT DOCUMENTS

| | | | |
|---|---|---|---|
| 3,308,345 | 3/1967 | Van Cortlandt Warrington | 324/520 |
| 3,515,943 | 6/1970 | Van Cortlandt Warrington | 317/27 |
| 4,281,386 | 7/1981 | Kondow et al. | 364/492 |
| 4,297,738 | 10/1981 | Lee | 361/42 |
| 4,313,146 | 1/1982 | Lee | 361/85 |
| 4,347,542 | 8/1982 | Calhoun | 361/76 |
| 4,347,738 | 9/1982 | Sanderson | 73/170 A |
| 4,466,071 | 8/1984 | Russell, Jr. | 364/492 |
| 4,470,092 | 9/1984 | Lombardi | 361/23 |
| 4,559,491 | 12/1985 | Saha | 324/52 |
| 4,719,580 | 1/1988 | Nimmersjö | 364/483 |
| 4,751,653 | 6/1988 | Junk et al. | 364/481 |
| 4,752,886 | 6/1988 | Gareis | 364/483 |
| 4,766,549 | 8/1988 | Schweitzer, III et al. | 364/481 |
| 4,785,406 | 11/1988 | Lunderius et al. | 364/483 |
| 4,795,983 | 1/1989 | Crockett et al. | 324/521 |
| 4,800,509 | 1/1989 | Nimmersjö | 364/492 |
| 4,812,995 | 3/1989 | Girgis et al. | 364/481 |
| 4,851,782 | 7/1989 | Jeerings et al. | 324/520 |
| 4,853,175 | 8/1989 | Book, Sr. | 376/216 |
| 4,855,671 | 8/1989 | Fernandes | 324/127 |
| 4,864,453 | 9/1989 | Bergman et al. | 361/66 |
| 4,868,704 | 9/1989 | Cavero | 361/80 |
| 4,871,971 | 10/1989 | Jeerings et al. | 324/509 |
| 4,878,142 | 10/1989 | Bergman et al. | 361/80 |
| 4,991,105 | 2/1991 | Pimental | 364/483 |
| 5,003,486 | 3/1991 | Hendel | 364/483 |

OTHER PUBLICATIONS

M. Aucoin, B.D. Russell, "Distribution High Impedance Fault Detection Utilizing High Frequency Current Components," *IEEE Transactions on Power Apparatus and Systems*, vol. PAS–101, No. 6, Jun., 1982, pp. 1596–1606.

M. Aucoin, B.D. Russell, "Detection of Distribution High Impedance Faults Using Burst Noise Signals Near 60 Hz," *IEEE Transactions on Power Delivery*, vol. PWRD–2, No. 2, Apr., 1987, pp. 342–348.

B.D. Russell, B.M. Aucoin, T.J. Talley, "Detection of Arcing Faults on Distribution Feeders," EL–2757, Research Project 1285–3, Final Report, Dec., 1982.

(List continued on next page.)

*Primary Examiner*—Jeffrey A. Gaffin
*Assistant Examiner*—Sally C. Medley
*Attorney, Agent, or Firm*—Flehr Hohbach Test Albritton & Herbert LLP

[57] ABSTRACT

A method and apparatus are provided for detecting an arcing fault on a power line carrying a load current. Parameters indicative of power flow and possible fault events on the line, such as voltage and load current, are monitored and analyzed for an arc burst pattern exhibited by arcing faults in a power system. These arcing faults are detected by identifying bursts of each half-cycle of the fundamental current. Bursts occurring at or near a voltage peak indicate arcing on that phase. Once a faulted phase line is identified, a comparison of the current and voltage reveals whether the fault is located in a downstream direction of power flow toward customers, or upstream toward a generation station. If the fault is located downstream, the line is de-energized, and if located upstream, the line may remain energized to prevent unnecessary power outages.

12 Claims, 3 Drawing Sheets

OTHER PUBLICATIONS

Carl Lee Benner, "An Algorithm for Faulted Phase and Feeder Selection Under High Impedance Fault Conditions," A Thesis Submitted to the Graduate College of Texas A&M University, Aug., 1988.

Patrick Wayne Carswell, "The Detection of High Impedance Faults Using Random Fault Behavior," A Thesis Submitted to the Graduate College of Texas A&M University, Aug., 1988.

C. Benner, P. Carswell, B.D. Russell, "Improved Algorithm for Detecting Arcing Faults Using Random Fault Behavior," *Electric Power Systems Research*, vol. 17, 1989, pp. 49–56.

Expert System For Detecting High Impedance Faults, U.S. Patent Application Serial No. 08/138,392, filed Oct. 15, 1993, invented by Russell et al.

Arc Spectral Analysis System, U.S. Patent Application Serial No. 08/138,489, filed Oct. 15, 1993, invented by Russell et al.

Load Analysis System For Fault Detection, U.S. Patent application Serial No. 08/138,144, filed Oct. 15, 1993, invented by Russell et al.

Load Extraction Fault Detection System, U.S. Patent Application Serial No. 08/138,413, filed Oct. 15, 1993, invented by Russell et al.

Randomness Fault Detection System, U.S. Patent Application Serial No. 08/138,410, filed Oct. 15, 1993, invented by Russell et al.

Energy Analysis Fault Detection System, U.S. Patent Application Serial No. 08/138,146, filed Oct. 15, 1993, by Russell et al.

"Detection of High Impedance Faults," EPRI Report, EL–2413, Prepared by Power Technologies, Inc., Jun. 1982.

"High Impedance Fault Detection Using Third Harmonic Current," EPRI Report, EL–2430, Prepared by Hughes Aircraft Company, Jun. 1982.

"The Characterization of High Impedance Faults," Prepared by PowerTech Labs, Inc., Canadian Electrical Association, Project 038 D 721, Jun. 1992.

M. Al–Dabbagh, R. Daoud, R. Coulter, "Improved Microprocessor Based Feeder Earth Fault Protection Using Pattern Recognition," Fourth International Conference on Developments in Power System Protection, Edinburgh, UK, Apr. 11–13, 1989.

M. Aucoin, "Status of High Impedance Fault Detection," *IEEE Transactions on Power Apparatus and Systems*, vol. PAS–104, No. 3, Mar. 1985, pp. 638–644.

B.M. Aucoin, J. Zeigler, B.D. Russell, "Feeder Protection and Monitoring System, Part I: Design, Implementation and Testing," *IEEE Transactions on Power Apparatus and Systems*, vol. PAS–104, No. 4, Apr. 1985, pp. 873–879.

B.M. Aucoin, J. Zeigler, B.D. Russell, "Feeder Protection and Monitoring System, Part II: Staged Fault Test Demonstration," *IEEE Transactions on Power Apparatus and Systems*, vol. PAS–104, No. 6, Jun. 1985, pp. 1456–1462.

H.J. Calhoun, M.T. Bishop, C.H. Eichler, R.E. Lee, "Development and Testing of an Electro–Mechanical Relay to Detect Fallen Distribution Conductors," *IEEE Transactions on Power Apparatus and Systems*, vol. PAS–101, No. 6, Jun. 1982, pp. 1643–1650.

J. Carr, "Detection of High Impedance Faults on Multi-Grounded Primary Distribution Systems," *IEEE Transactions on Power Apparatus and Systems*, vol. PAS–100, No. 4, Apr. 1981, pp. 2008–2016.

R.D. Christie, H. Zadehgol, M.M. Habib, "High Impedance Fault Detection in Low Voltage Networks," IEEE Power Engineering Society Summer Meeting, Seattle, Washington, Jul. 1992, IEEE Paper No. 92 SM 507–4 PWRD.

J.R. Dunki–Jacobs, "The Effects of Arcing Ground Faults on Low–Voltage System Design," *IEEE Transactions on Industry Applications*, vol. IA–8, No. 3, May/Jun. 1972, pp. 223–230.

S.D. Ebron, D.L. Lubkeman, M. White, "A Neural Network Approach to the Detection of Incipient Faults on Power Distribution Feeders," *IEEE Transactions on Power Delivery*, vol. 5, No. 2, Apr. 1990, pp. 905–912.

A.E. Emanuel, D. Cyganski, J.A. Orr, "High Impedance Fault Arcing on Sandy Soil in 15kV Distribution Feeders: Contributions to the Evaluation of the Low Frequency Spectrum," *IEEE Transactions on Power Delivery*, vol. 5, No. 2, Apr. 1990, pp. 676–684.

A.A. Girgis, W. Chang, E.B. Makram, "Analysis of High–Impedance Fault Generated Signals Using a Kalman Filtering Approach," *IEEE Transactions on Power Delivery*, vol. 5, No. 4, Nov. 1990, pp. 1714–1720.

C. Huang, H. Chu, M. Chen, "Algorithm Comparison for High Impedance Fault Detection Based on Staged Fault Test," *IEEE Transactions on Power Delivery*, vol. 3, Oct. 1988, pp. 1427–1434.

D.I. Jeerings, J.R. Linders, "A Practical Protective Relay for Down–Conductor Faults," *IEEE Transactions on Power Delivery*, vol. 6, Apr. 1991, pp. 565–571.

J.R. Linders, D.I. Jeerings, "Down–Conductor Detection: Theory and Practice," Texas A & M Conference for Protective Relay Engineers, College Station, Texas, Apr. 1993.

D.I. Jeerings, J.R. Linders, "Ground Resistance—Revisited," *IEEE Transactions on Power Delivery*, vol. PWRD–4, No. 2, Apr. 1989, pp. 949–956.

D.I. Jeerings, J.R. Linders, "Unique Aspects of Distribution System Harmonics Due to High Impedance Ground Faults," *IEEE Transactions on Power Delivery*, vol. 5, Apr. 1990, pp. 1086–1092.

A.T. Johns, P. Agrawal, "New Approach to Power Line Protection Based Upon the Detection of Fault Induced High Frequency Signals," *IEEE Proceedings, Part C, Generation, Transmission and Distribution*, vol. 137, No. 4, Jul. 1990, pp. 307–313.

R.H. Kaufmann, J.C. Page, "Arcing Fault Protection for a Low Voltage Power Distribution System—Nature of the Problem," *AIEE Transactions on Power Apparatus and Systems*, Jun. 1960, pp. 160–167.

C.J. Kim, B.D. Russell, "A Learning Method for Use in Intelligent Computer Relays for High Impedance Faults," *IEEE Transactions on Power Delivery*, vol. 6, No. 1, Jan. 1991, pp. 109–115.

C.J. Kim, B.D. Russell, K. Watson, "A Parameter–Based Process for Selecting High Impedance Fault Detection Techniques Using Decision Making Under Incomplete Knowledge," *IEEE Transactions on Power Delivery*, vol. 5, No. 3, Jul. 1990, pp. 1314–1320.

C.J. Kim, B.D. Russell, "Harmonic Behavior During Arcing Faults on Power Distribution Feeders," *Electric Power Systems Research*, vol. 14, No. 3, Jun. 1988, pp. 219–225.

C.J. Kim, B.D. Russell, "Classification of Faults and Switching Events by Inductive Reasoning and Expert System Methodology," *IEEE Transactions on Power Delivery*, vol. 4, Jul. 1990, pp. 1631–1637.

C.J. Kim, B.D. Russell, "High Impedance Fault Detection System Using an Adaptive Element Model," *IEE Proceedings–C*, vol. 140, No. 2, Mar. 1993, pp. 153–159.

W.H. Kwon, G.W. Lee, Y.M. Park, M.C. Yoon, M.H. Yoo, "High Impedance Fault Detection Utilizing Incremental Variance of Normalized Even Order Harmonic Power," *IEEE Transactions on Power Delivery*, vol. 6, Apr. 1991, pp. 557–563.

R.E. Lee, M.T. Bishop, "Performance Testing of the Ratio Ground Relay on a Four–Wire Distribution Feeder," *IEEE Transactions on Power Apparatus and Systems*, vol. PAS–102, No. 9, Sep. 1983, pp. 2943–2948.

M. Narendorf, B.D. Russell, M. Aucoin, "Microcomputer Based Feeder Protection and Monitoring System—Utility Experience," *IEEE Transactions on Power Delivery*, vol. PWRD–2, No. 4, Oct. 1987, pp. 1046–1052.

R.M. Reedy, "Minimize the Public Risk of Downed Conductors," *Electrical World*, Sep. 1989, pp. S–36, 38, 40.

B.D. Russell, R.P. Chinchali, "A Digital Signal Processing Algorithm for Detecting Arcing Faults on Power Distribution Feeders," *IEEE Transactions on Power Delivery*, vol. PWRD–3, No. 4, Jan. 1989, pp. 132–140.

B.D. Russell, R.P. Chinchali, C.J. Kim, "Behaviour of Low Frequency Spectra During Arcing Fault and Switching Events," *IEEE Transactions on Power Delivery*, vol. 3, No. 4, Oct. 1988, pp. 1485–1491.

B.D. Russell, K. Mehta, R.P. Chinchali, "An Arcing Fault Detection Technique Using Low Frequency Current Components—Performance Evaluation Using Recorded Field Data," *IEEE Transactions on Power Delivery*, vol. PWRD–3, No. 4, Oct. 1988, pp. 1493–1500.

B.D. Russell, K. Watson, "Power Substation Automation Using a Knowledge Based System—Justification and Preliminary Field Experiments," *IEEE Transactions on Power Delivery*, vol. PWRD–2, No. 4, Oct. 1987, pp. 1090–1095.

A.F. Sultan, G.W. Swift, D.J. Fedirchuk, "Detection of High Impedance Arcing Faults Using a Multi–Layer Perceptron," *IEEE Transactions on Power Delivery*, vol. 7, No. 4, Oct. 1992, pp. 1871–1877.

T.J. Talley, "Power Spectrum Estimates of High Frequency Noise Generated by High Impedance Arcing Faults on Distribution Systems," Master of Science Thesis, Texas A & M University, Dec. 1979.

A.R. van C. Warrington, *Protective Relays: Their Theory and Practice*, vol. 2, London: Chapman and Hall, 1969, pp. 340–347 only.

A.C. Westrom, A.P. Sakis Meliopoulos, G.J. Cokkinides, "Open Conductor Detector System," *IEEE Transactions on Power Delivery*, vol. 7, Jul. 1992, pp. 1643–1650.

ARC BURST PATTERN ANALYSIS FAULT DETECTION SYSTEM

This is a continuation of application Ser. No. 08/138,477 filed Oct. 15, 1993 now abandoned.

This invention was made with government support under contract nos. RF 5459 and RF 5672 from the National Aeronautics and Space Administration, (NASA), as well as contract no. RF 5927 from the National Science Foundation (NSF). The United States government may have certain rights in this invention.

BACKGROUND OF INVENTION

The present invention relates generally to an analysis system for use with an electrical utility power system, and more particularly to an arc burst pattern analysis fault detection system for detecting high impedance, low current arcing faults on the power system. Arcing faults may be caused by, for example, downed, broken, tangled or dangling power lines, trees contacting the power lines, and various overcurrent fault situations.

Arcing faults are more difficult to detect than permanent overcurrent faults, which for instance, occur when a transformer fails. Most conventional overcurrent protection devices, such as fuses, reclosures, relays and the like, have time delays which prevent a temporary fault from de-energizing the power line. Only if the overcurrent fault persists does such a protection device de-energize the power line. Some arcing faults may initialize the timing circuits of the overcurrent protection devices but, by the end of the time delay, the high impedance nature of the fault limits the fault current to a low value. Such overcurrent protection devices cannot distinguish this low fault current from the levels of current ordinarily drawn by customers; hence, the line may remain energized even though a dangerous arcing fault exists on the power line.

Other methods of fault analysis have focused on determining the location of a fault, rather than a method and apparatus for detecting the existence of an arcing fault, as claimed below. For example, one earlier method for determining the location of a fault on a power circuit is proposed by Saha in U.S. Pat. No. 4,559,491. Saha determines the fault location and the type of fault on a transmission line, but does not perform fault detection per se. Saha computes the fault location using vector measurements to obtain the line impedance from which the fault location is determined. Moreover, Saha uses only the single fundamental waveform, ignoring the wealth of information contained in the remainder of the waveform.

Saha's system lacks the ability to detect the presence of an arcing fault. Unfortunately, the Saha method requires a steady state fault for effective determination of the fault's location. Since arcing faults may exhibit a highly variable behavior from one cycle to the next, the Saha approach is clearly ineffective for identifying arcing faults. Moreover, the Saha approach is generally ineffective for use in radial distribution circuits with multiple conductive paths. Furthermore, the apparent impedance of an arcing fault may well be within the acceptable impedance ranges for loads normally connected to a line. Thus, the Saha approach is clearly unable to discriminate arcing faults from these normal loads.

U.S. Pat. No. 4,281,386 to Kondow proposes a fault detection system based upon an impedance measuring scheme. Kondow indicates the presence of a fault when the impedance falls within a certain zone defined by Kondow. Kondow's system lacks the ability to detect the presence of an arcing fault. Arcing faults may exhibit highly variable behavior from one cycle to the next, thus rendering the Kondow approach ineffective. Furthermore, the apparent impedance of an arcing fault may well be within the acceptable ranges of loads normally receiving power from the line. The Kondow approach would either be unable to detect many arcing faults or would falsely identify normal loads as arcing faults.

In U.S. Pat. No. 4,719,580, Nimmersjo detects and locates faults using a traveling wave analysis technique. Such a traveling wave analysis requires very fast sampling of signals to capture the wavefronts. The Nimmersjo approach is unable to effectively detect an arcing fault. Nimmersjo relies upon traveling wave signals which may occur for faults as well as for normal switching events on a line. Thus, the Nimmersjo approach simply cannot discriminate between faults and switching events. Furthermore, Nimmersjo cannot effectively determine a location of a fault in a distribution circuit having multiple conductive paths.

Thus, a need exists for an improved arc burst pattern analysis fault detection system for electrical power utilities which is directed toward overcoming, and not susceptible to, the above limitations and disadvantages.

SUMMARY OF THE INVENTION

The present invention encompasses a detection system for analyzing an arc burst pattern exhibited by arcing faults in a power system. These arcing faults are detected by identifying bursts of each half-cycle of the fundamental current. If the bursts occur at or near a voltage peak on the phase in question, then arcing is indicated on that phase. In an illustrated embodiment, the system first determines the faulted phase by calculating X-indicators (e.g., $X_A$, $X_B$ and $X_C$ for a three phase system) to determine the numerical correlation of each phase with a model function. The faulted phase has an X-indicator which appears significantly higher than the indicators for the other phases.

In the illustrated embodiment, the model function exemplifies the shape of an arcing fault wave form based on the phase relationship between the arcing fault current and the power system phase voltage. If the faulted phase has been identified, the system also determines the location of the arcing fault relative to a monitoring point on the power line. If the X-indicator of the faulted phase is positive, then the fault is located downstream, toward the customer, from the measuring point, and upstream toward the generating station if the X-indicator is negative.

According to one aspect of the present invention, a method of detecting arcing faults occurring on a polyphase power line, includes the step of monitoring load current flowing through each phase of the line. In an analyzing step, each phase of the monitored load current is analyzed by comparison with a selected model function to determine an indicator for each phase. In a comparing step, the indicator for each phase is compared with the indicator of each other phase to determine whether one phase having an arcing fault can be identified.

According to another aspect of the present invention, an apparatus is provided for detecting arcing faults through an arc burst pattern analysis.

An overall object of the present invention is to provide a fault detection system for detecting faults that are too small to be properly recognized by conventional overcurrent protection systems.

A further object of the present invention is to provide a fault detection system for accurately identifying dangerous high impedance arcing faults.

Another object of the present invention is to provide a fault detection system for locating the direction of high impedance arcing fault relative to a monitoring location of the system.

Still another object of the present invention is to provide a fault detection system which is faster, more economical, and more reliable than the earlier systems.

The present invention relates to the above features and objects individually as well as collectively. These and other objects, features and advantages of the present invention will become apparent to those skilled in the art from the following description and drawings.

DETAILED DESCRIPTION OF A PREFERRED EMBODIMENT

Figure 1:
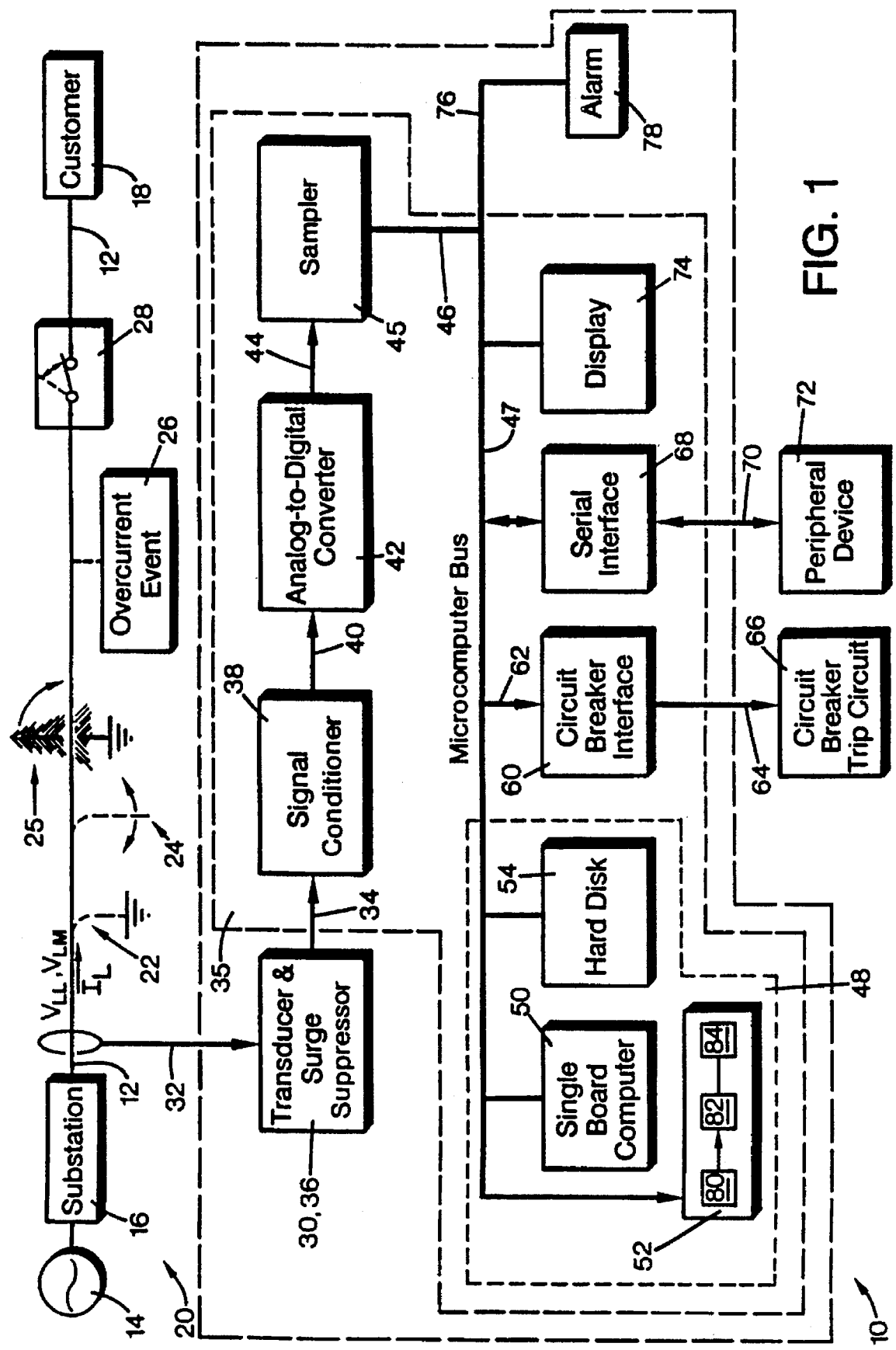
FIG. 1 is a schematic block single line diagram of one form of an arc burst pattern analysis fault detection system of the present invention.

Referring to FIG. 1, an arc burst pattern analysis fault detection system or detector 10 constructed in accordance with the present invention is shown coupled to detect faults, such as high impedance, low current, arcing faults on a feeder line 12. The arc burst pattern analysis detector 10 may be operated alone, or as a portion of a higher level fault analysis scheme, such as the one disclosed in one of the coinventors' other concurrently filed patent applications, entitled, "Expert System." The feeder line 12 receives power from an AC power source, such as a generating station 14, through a substation 16. Other feeder lines (not shown) may also receive power from the generating station 14 and exit the substation 16. The feeder line 12 delivers power from the substation 16 to a variety of utility customers, such as customer 18.

Altogether, the generating station 14, the substation 16, and feeder line 12 illustrate a portion of an electrical utility's power system 20. Most typical power systems generate and distribute power using a three phase system. Thus, the feeder line 12 may deliver power over three phase lines, known as phases A, B, and C. The feeder line 12 may also have a neutral conductor. For convenience, power system 20 illustrated herein is such a three phase system.

Between the substation 16 and the customer 18, the feeder line 12 may be subjected to a variety of different types of events, activities and faults. Some typical faults are illustrated in FIG. 1, specifically, an arcing fault caused by a downed conductor 22, a dangling conductor 24, or momentary contact of a tree 25 or other object with the feeder line 12. The system may also be subject to other disrupting events, such as an overcurrent event 26, and a switching event 28 performed by a conventional recloser or the like.

The detector 10 includes a monitoring device, such as a sensor or transducer 30, coupled to feeder line 12 as indicated schematically by line 32. The term "monitoring device" is broadly defined herein to include sensing devices, detecting devices, and any other structurally equivalent device or system understood to be interchangeable therewith by those skilled in the art. The illustrated transducer 30 senses or monitors several line parameters, such as line voltages for each phase (line-to-line $V_{LL}$ or line-to-neutral $V_{LN}$), or load current $I_L$ flowing through line 12 for each phase.

For instance, in response to monitoring the load current $I_L$ and line-to-neutral (phase) voltages, transducer 30 produces parameter signals, here, a dual load current and phase voltage signal 34, from which the fault components of the parameter may be determined. The transducer 30 may be a conventional transducer or an equivalent device, such as a multiple phase current measuring device typically having one current transformer per phase, plus one on the neutral conductor, of the feeder line 12, and a phase voltage measuring device, measuring the line-to-neutral voltages for each phase of line 12. Moreover, the controller 35 may receive transducer signals from already existing current and voltage sensors. For example, if only a single phase of the voltage is measured by transducer 30 or another transducer (not shown), the controller 35 may be equipped with conventional hardware or software known to those skilled in the art to derive the other two phases. That is, knowing one phase, the other two phases may be obtained by applying the appropriate plus/minus 120° phase shift to the monitored phase voltage. It is also conceivable that other parameters of the power flowing through line 12 may be measured, with suitable transducers selected to accomplish the desired monitoring, for instance, power factor.

The detector 10 may also include surge protection, for example, a surge suppressor or protector 36. The surge protector 36 may be supplied either with the transducer 30, as illustrated, or as a separate component. The surge protector 36 protects the detector 10 from power surges on the feeder line 12, such as those caused by lightning strikes or the like.

A controller 35 receives the parameter signals 34 from transducer 30. The controller 35 may include a signal conditioner 38 for filtering and amplifying the parameter signals 34 to provide a clean conditioned signal 40. Preferably, the signal conditioner 38 includes a low-pass filter suitable for satisfying the Nyquist criteria of sampling, known to those skilled in the art. In a preferred embodiment, non-fundamental components of current, such as those in the range of 90–960 Hertz (Hz), are filtered or used in analysis by detector 10 from the current portion of the parameter signal 34. It is apparent that the arc burst detector 10 may be used with any other single frequency in the spectrum, or a combination of frequencies.

The signal conditioner 38 may also amplify the parameter signals 34 for the appropriate gain required by an analog-to-digital (A/D) converter 42. For example, the current flowing on the power system 20 may have a dynamic range of 10 to 10,000 Amps, so the signal conditioner 38 appropriately scales these signals for conversion by the A/D converter 42 from an analog signal 40 into a digital parameter signal 44.

When the transducer 30 is an analog device, the controller 35 includes the illustrated discrete A/D converter 42. The transducer 30 may also be implemented as a digital device which incorporates the signal conditioning function of conditioner 38 and the analog-to-digital conversion function of the A/D converter 42.

Additionally, the controller 35 may include a power parameter sampling device or sampler 45. The illustrated sampler 45 samples the digitized current signal 44 at selected intervals to provide an accurate representation of the load level due to rapidly changing conditions, such as during arcing faults.

In the illustrated embodiment, the sampler 45 provides a sampler signal 46 corresponding to the sampled line parameter values, such as line current $I_L$ or voltage (line-to-line $V_{LL}$ or line-to-neutral $V_{LN}$). The sampler signal 46 is supplied via a microcomputer bus 47 to a computing device, such as a microcomputer system 48. The illustrated microcomputer system 48 has a computer, which may be a single-board computer 50, coupled with a memory device, for instance, a random-access memory 52, and a data storage device, such as a hard disk 54. A suitable microcomputer system 48 may include a conventional personal computer or any other equivalent device known to be interchangeable by those skilled in the art.

The sampler 45 may measure the line parameter values on a time-domain basis, or the sampling function may be conducted by microcomputer system 48. Other details of the sampling process are described below. It is apparent to those skilled in the art that other variations of these sensing and sampling functions are also possible. For instance, line-to-line voltages $V_{LL}$ or line-to-neutral voltages $V_{LN}$ may be monitored, sampled and analyzed, as well as the line current $I_L$.

The controller 35 has a circuit breaker interface 60 for receiving a trip command signal 62 from the computer 50 via bus 47. In response to the trip command signal 62, the interface 60 sends a trip signal 64 to a circuit breaker trip circuit 66. The trip circuit 66 drives a circuit breaker (not shown) located at substation 16 to de-energize ("trip") feeder line 12.

The controller 35 may also include an optional serial interface 68, such as a modem for sending and receiving a peripheral device signal 70 over a telephone network. The interface 68 may communicate with an external peripheral device 72, such as a remotely located power distribution control center. In some systems, the peripheral device 72 may provide a remote input to the detector 10 via serial interface 68, for example, to override previous programming of the detector 10, such as initial settings, sampling rates, a sampling time period, and the like.

Controller 35 may also include an output device, such as a visual display device 74, or a printer. Preferably, the output display 74 provides a visual indication of the status of detector 10, line 12, and the previous operating conditions of the line. The controller 35 may also provide an alarm signal 76 via bus 47 to an alarm 78, which may be visual, audible, or both.

In the utility industry, it is generally accepted that power distribution involving voltage levels below 25 kV are problematic in the area of high impedance fault detection. The problems associated with this detection are partially due to the fact that at this voltage, the arc impedance is relatively high, and therefore, the fault current is low. Furthermore, the mechanics of the fault are such that steady arcs are typically not sustained. Thus, the arcing stops before fuses are able to blow and before overcurrent protection devices are able to operate. Of course, this same difficulty may also be encountered in distribution systems operating at voltage levels of 25 kV and above.

Typically, the fault current magnitude of a high impedance fault on the distribution system 20 is dependant upon the various environmental conditions at the fault site. For example, the current magnitude will fluctuate as the resistance of the current path changes due to the presence of ionized gases, soil particles and the like in the current path, as well as the type of grounding surface in contact with the live conductor. Thus, the fault current magnitude is simply not related to the normal voltage or current levels of the line, nor to the rated capacities of the distribution system.

OPERATION

Figure 2:
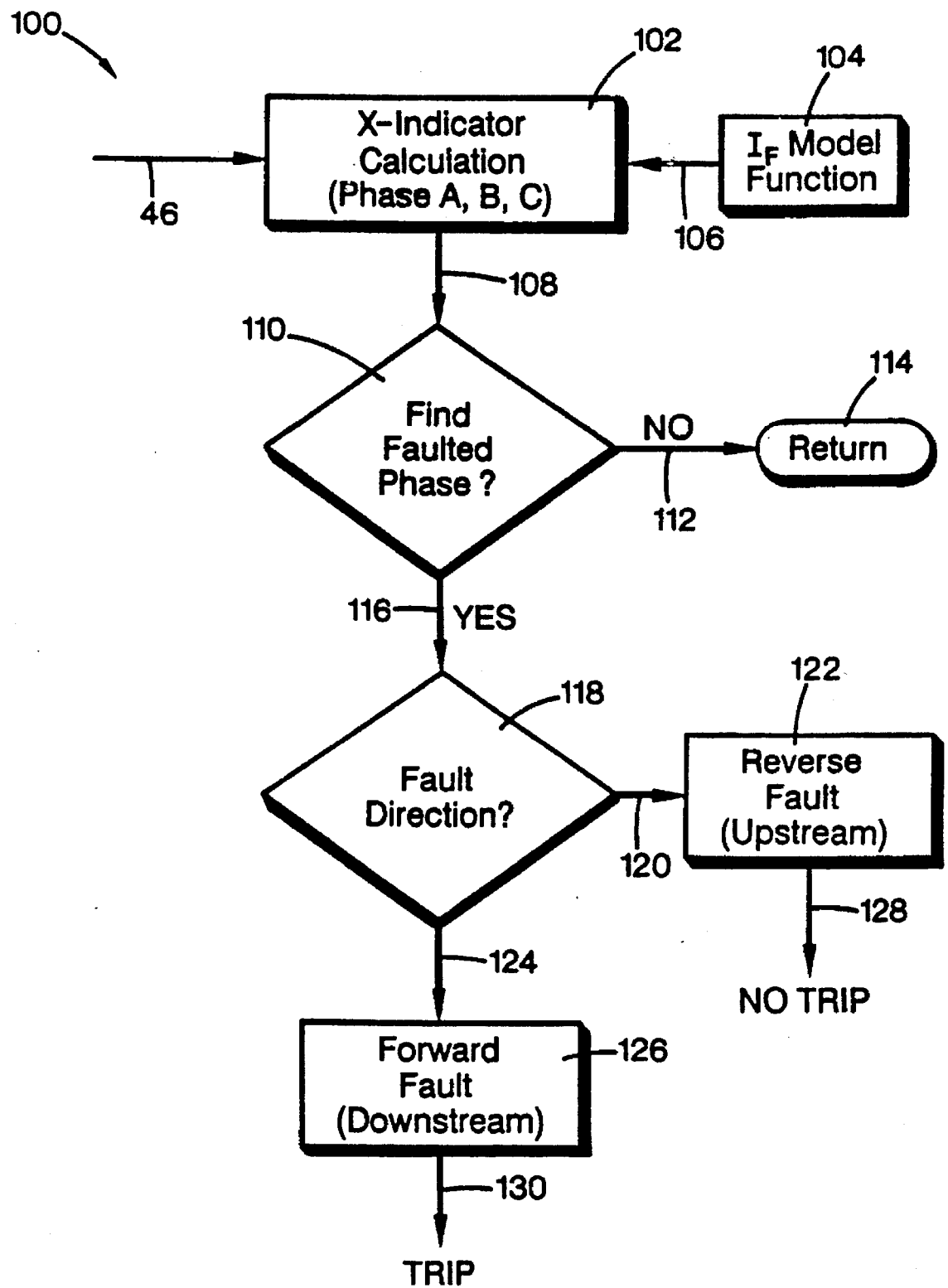
FIG. 2 is a flow chart illustrating one manner of operating the system of FIG. 1.

Referring now to FIG. 2, a flow chart 100 in accordance with the present invention illustrates one manner of operating the detector 10. This method is schematically illustrated in flow chart 100 as a series of steps or portions. A portion is defined broadly herein as a component for performing a processing step, as well as a step portion of the illustrated process, which may be implemented by hardware, software or combinations thereof known to those skilled in the art.

Referring back to FIG. 1, in general, detector 10 monitors parameters indicative of power flow and possible fault events on the feeder line 12. From this monitoring, detector 10 assembles a collection of data, which is stored in selected buffers or "windows," such as one of buffers 80 and 82 of RAM 52. The RAM 52 also has a counter portion 84, which may be used in compiling the incoming data to make the fault determinations described below.

The arc burst pattern analysis detector 10 identifies the occurrence of arcing bursts in the time domain according to their relation to the applied system voltage and load current. The timing of the arc bursts is correlated with the peaks of the applied system voltage, such as $V_{LN}$, to determine the presence of an arcing fault 24. The microcomputer system 48 analyzes the monitored patterns or signatures in the circuit current over time, and makes determinations about the occurrences which produced recognized fault current patterns. For example, the current and voltage of the line 12 are sampled by sampler 45 at a rate of 1920 Hz, and the samples of data are complied in buffer 80. The compiled data may then analyzed for the occurrence of arc bursts, for instance, once every second.

In the preferred embodiment, the detector 10 identifies arc bursts in the 90–960 Hz current frequency range, and then correlates these arc bursts to the peak values of the applied system voltage $V_{LN}$ on the phase displaying the arc burst signature. If the arc bursts occur at or near the voltage peak, then arcing on that phase is indicated by detector 10. If the arc burst occurs at a different time, for example, at a voltage zero crossing, then there may or may not be arcing on another phase, or the burst may not be related to arcing but to some other phenomena.

The arc bursts pattern analysis detector 10 as described herein may be used in a stand alone configuration, or in conjunction with other fault detection schemes which may share the same components as shown in FIG. 1. For example, the arc burst pattern analysis detector 10 may be used to confirm the presence of an arcing fault which has been detected by another fault detection system (not shown). These other fault detection systems may recognize high current or low current faults on the feeder line 12.

Advantageously, the arc burst pattern analysis detector 10 may operate in conjunction with these other fault detection systems to provide further information about a possible arcing fault, which yields a greater confidence in determining whether or not a fault exists on the line. That is, if several such detection systems indicate the presence of an arcing fault, then a very high level of confidence exists in determining that an arcing fault does indeed exist on feeder line 12 to justify deenergization of the line.

Thus, using the arc burst pattern analysis detector 10, particularly when used in conjunction with other detection systems, allows for the implementation of a highly sensitive fault detection system on a utility distribution circuit while minimizing unnecessary power outages to customers 18. This system allows dangerous arcing faults which would normally be missed by conventional reclosers, breakers, fuses and the like, to instead be detected, the line be deenergized, and the chance of injury due to the presence of a fallen conductor 24 minimized.

In overview, the detector 10 first determines, if possible, which phase is faulted. Then, if the detector was able to determine which phase was faulted, the system 10 then determines the direction of the fault relative to the location of transducer 30. The fault may be in the forward direction of power flow, that is downstream toward the customer 18, or in a reverse direction, upstream from the monitoring point 30 towards the generation station 14.

If the fault is located downstream toward the customer, then a trip signal 64 may be issued to the circuit breaker trip circuit 66 to deenergize line 12. However, if the fault is located upstream toward the generating station, there is no need to deenergize feeder line 12 because the arcing fault exists elsewhere. Thus, by distinguishing between upstream and downstream locations of the fault, unnecessary power outages for customers 18 are avoided when the fault is located upstream of feeder line 12.

In a first portion of the method, the detector 10 determines which phase is faulted. Such a determination may not be possible in all cases, but first the attempt is made. The system 10, as shown in flow chart 100, includes an X-indicator calculation analyzer portion or X-calculator 102, which receives the sample signal 46 from sampler 45. The X-calculator 102 determines the X-indicator for each phase (here A, B and C for the illustrated three phase system) by calculating its numerical correlation to a model function stored within a model function portion 104. This correlation is accomplished by the integration (summation) process defined below.

Figure 3:
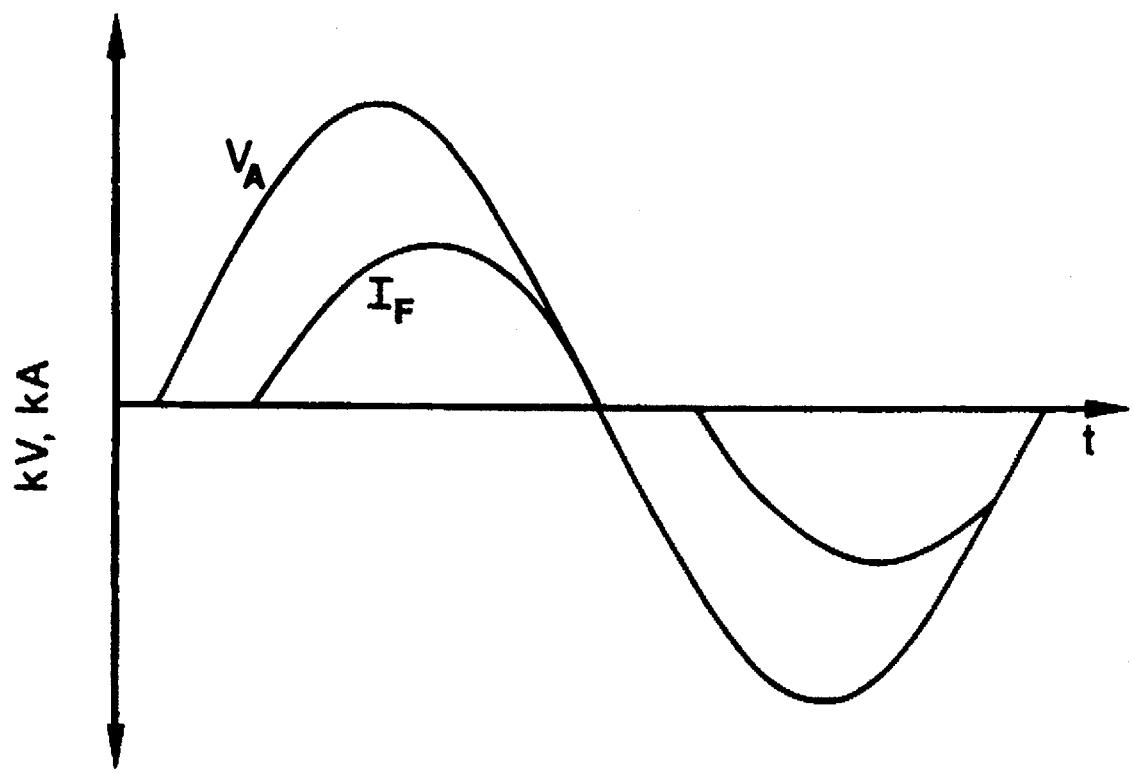
FIG. 3 is a graph of one form of a model waveform for the system of FIGS. 1 and 2.

The model function portion 104 may be stored in buffer 82 of RAM 52, or another suitable location, but is preferably stored on hard disk 54. The model function portion 104 supplies the model function to the X-calculator 102 by a model function signal 106. Preferably, this model function is based on the phase relationship of arcing fault current with the power system phase voltage which drives the arcing fault. The model function is stored relative to the phase voltage. For example, one form of a model function for current "$I_F$" and its relation to a given phase voltage, here "$V_A$" for phase A, is shown in FIG. 3. While the model function is illustrated in units of kilovolts (kV) and kiloamperes (kA), it is apparent that a per unit scaling system may be more appropriate for some implementations. The X-indicator calculation assures that the correlation is referenced to the voltage zero crossing, which advantageously makes this phase relationship implicit in the $I_F$ model function.

Thus, the model function 104 has the shape of an arcing fault waveform, which may be determined empirically by simulating a fault on the line and taking measurements, or mathematically using known parameters in various power system analysis modeling programs. The model function storage portion 104 may store a model for only one phase, such as phase A current, to conserve storage space. The arcing models for phases B and C may then be obtained the X-indicator calculator 102 preforming the preliminary step of shifting the phase A model by +/−120°, which corresponds to the nominal phase relationships of the fundamental power system voltage (for the illustrated three-phase system).

The X-calculator 102 determines the X-indicators as follows:

$$X_A = \rho_{IA,IF}$$

-continued
$$X_B = \rho_{IB,IF}$$

$$X_C = \rho_{IC,IF}$$

$$\text{where } \rho_{a,b} = \frac{f(a,b)}{\sqrt{f(a,a)f(b,b)}}$$

$$\text{and } f(x,y) = \int_T x(t)y(t)dt$$

Or in digital form, the X-calculator 102 function may be expressed as:

$$f(x,y) = \sum_N x(t)y(t)\Delta t$$

The X-calculator provides an X-indicator signal 108 to a faulted phase comparator ("Find Faulted Phase?") portion or phase finder 110. The phase finder 110 searches for one X-indicator which has an absolute value magnitude that is significantly higher than the other two X-indicators according to the following:

$|X_A| \gg |X_B|$ and $|X_A| \gg |X_C|$ => Faulted Phase is A $|X_B| \gg |X_A|$ and $|X_B| \gg |X_C|$ => Faulted Phase is B $|X_C| \gg |X_A|$ and $|X_C| \gg |X_B|$ => Faulted Phase is C Otherwise, Faulted Phase is UNKNOWN.

Here, the symbol >> refers to "significantly greater," such as on the order of two times larger.

If the phase finder 110 is unable to determine which phase is faulted, a NO signal 112 is issued to a return portion 114. The return portion 114 may provide an output to the display 74, peripheral device 72 and/or alarm 78 to indicate a fault has been detected, but the exact phase having the fault is unknown. If the phase finder 110 is able to determine which phase is faulted, it issues a YES signal 116 to a fault direction comparator ("Fault Direction?") portion or direction finder 118. The direction finder 118 examines the sign (positive or negative) of the X-indicator corresponding to the faulted phase according to the following comparison:

If Faulted Phase is known:

Faulted phase is A and $X_A > 0$ then Direction is Forward

Faulted phase is B and $X_B > 0$ then Direction is Forward

Faulted phase is C and $X_C > 0$ then Direction is Forward

Otherwise, Direction is REVERSE.

If the direction finder 118 determines the fault has a reverse direction and is located upstream, it issues a forward signal 120 to an upstream or reverse fault indicator portion 122. If the direction finder 118 determines the fault is located forward of the monitoring location of transducer 30, that is in the downstream direction toward customer 18, then a forward signal 124 is issued to a forward or downstream fault indicator portion 126.

The reverse fault indicator 122 issues a NO TRIP signal 128, which then may be displayed on the peripheral device 72 or display 74, for example, in the nature of a warning that an arcing fault exists on the system 20, but not on feeder 12. The forward fault indicator 126, in response to signal 124, issues a TRIP signal 130, which may be used as one input to a higher level controller (not shown), receiving inputs from other fault detection systems. Alternatively, the TRIP signal 130 may be used to generate the trip signal 64 for deenergizing feeder line 12 directly, for instance, if detector 10 is used in a stand-alone configuration. Thus, false trips are advantageously avoided using the directional fault indication function illustrated in flow chart 100.

An operational example, for the X-calculator 102 to show the generation of the model current functions is given below:

$$I_A(t) = \begin{bmatrix} 0 \text{ for } & 0° \leq t < 120° \\ 1 \text{ for } & 120° \leq t < 180° \\ 0 \text{ for } & 180° \leq t < 300° \\ -1 \text{ for } & 300° \leq t < 360° \end{bmatrix}$$

$$I_B(t) = I_A(t - 120°)$$

$$I_C(t) = I_C(t + 120°)$$

Note that the +\−120° constants shown in the definitions of $I_B$ and $I_C$ assume the phase rotation of power system 20 is in an ABC direction. It is apparent to those skilled in the art that these equations may be modified for use with the system having an ACB phase rotation by simply reversing the signs of the 120° constants in the definitions of $I_B$, $I_C$. Furthermore, it is apparent to those skilled in the art that these are only examples of the definitions for the model current functions, and other functions may be defined for other specific implementations, for instance a six phase transmission system.

The above definitions for the functions of the X-indicator calculator 102 and the faulted phase finder 110, as well as the direction finder 118, assume that only one voltage signal, in the example phase A, is available for monitoring. It is apparent that these equations may be modified appropriately if the phase B or phase C voltages are instead monitored by the transducer 30 or another transducer (not shown).

Moreover, if more than one phase voltage signal is monitored, then each of the three model currents may be referenced to its own respective voltage signal, eliminating the need for the 120° phase shift required when only one voltage signal is monitored. Nonetheless, the example given above is believed to be the most typically useful, since most power substations presently constructed have only one phase voltage signal available for monitoring purposes, and usually this is phase A.

CONCLUSION

Having illustrated and described the principles of our invention with respect to a preferred embodiment, it should be apparent to those skilled in the art that our invention may be modified in arrangement and detail without departing from such principles. For example, while the illustrated embodiment has been implemented in computer software, or discussed in terms of devices in some instances, structural equivalents of the various hardware components and devices, as well as structurally equivalent data processing routines, may be substituted as known to those skilled in the art to perform the same functions. Furthermore, while various hardware devices, such as the transducer, sampler and microcomputer system are illustrated, it is apparent that other devices known to be interchangeable by those skilled in the art may be substituted. We claim all such modifications falling within the scope of the following claims.

We claim:

1. A method of detecting arcing faults occurring on a polyphase power network, comprising the steps of:

low-pass filtering a load current waveform flowing through each phase of said polyphase power network to produce a low-pass filtered load current waveform with preserved low frequency components;

correlating said low-pass filtered load current waveform with a selected model function, with values that fluctuate as a function of the power system phase voltage, to produce an indicator for each phase of said polyphase power network;

comparing each indicator with the remaining indicators to determine whether a phase with an arcing fault can be identified; and determining the direction of an existing arcing fault based upon said indicators.

2. The method of claim 1 wherein said comparing step includes the step of comparing the absolute values of said indicators.

3. The method of claim 2 wherein said comparing step includes the step of determining if any phase has an indicator with a magnitude that is significantly greater than any other indicator.

4. The method of claim 1 wherein said selected model function has a first set of values for a first phase of said polyphase power network, and a second set of values for a second phase of said polyphase power network.

5. The method of claim 4 wherein said first set of values and said second set of values of said model function are specified in relation to zero crossings of said power system phase voltages.

6. The method of claim 4 wherein said second set of values are shifted in relation to said first set of values corresponding to the nominal phase relationship between said second phase and said first phase.

7. A detector to identify arcing faults occurring on a polyphase power network, comprising:

a low-pass filter to filter a load current waveform flowing through each phase of said polyphase power network to produce a low-pass filtered load current waveform with preserved low frequency components;

a correlation device to correlate said low-pass filtered load current waveform with a selected model function, with values that fluctuate as a function of the power system phase voltage, to produce an indicator for each phase of said polyphase power network; and a comparator to compare each indicator with the remaining indicators to determine whether a phase with an arcing fault can be identified and determine the direction of an existing arcing fault based upon said indicators.

8. The detector of claim 7 wherein said comparator compares the absolute values of said indicators.

9. The detector of claim 8 wherein said comparator determines if any phase has an indicator with a magnitude that is significantly greater than any other indicator.

10. The detector of claim 7 wherein said selected model function has a first set of values for a first phase of said polyphase power network, and a second set of values for a second phase of said polyphase power network.

11. The detector of claim 10 wherein said first set of values and said second set of values of said model function are specified in relation to zero crossings of said power system phase voltages.

12. The detector of claim 11 wherein said second set of values are shifted from said first set of values corresponding to the nominal phase relationship between said first phase and said second phase.

* * * * *